United States Patent
Sugawara

(10) Patent No.: US 9,462,205 B2
(45) Date of Patent: Oct. 4, 2016

(54) IMAGE PROCESSING DEVICE, IMAGING DEVICE, IMAGE PROCESSING METHOD, AND NON-TRANSITORY COMPUTER READABLE MEDIUM

(71) Applicant: FUJIFILM Corporation, Tokyo (JP)

(72) Inventor: Kazufumi Sugawara, Saitama (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/742,326

(22) Filed: Jun. 17, 2015

(65) Prior Publication Data

US 2015/0312505 A1   Oct. 29, 2015

Related U.S. Application Data

(63) Continuation of application No. PCT/JP2013/083934, filed on Dec. 18, 2013.

(30) Foreign Application Priority Data

Dec. 18, 2012   (JP) ................................. 2012-275944

(51) Int. Cl.
*H04N 5/232*   (2006.01)
*H04N 5/357*   (2011.01)
(Continued)

(52) U.S. Cl.
CPC .............. *H04N 5/3765* (2013.01); *G02B 7/34* (2013.01); *H01L 27/14621* (2013.01);
(Continued)

(58) Field of Classification Search
CPC ........... H04N 5/3765; H04N 5/23212; H04N 5/357; H04N 5/3696; H04N 5/378; H04N 9/045; G02B 7/34; H01L 27/14621

USPC ......... 348/229.1, 255, 223.1, 241, 349, 528, 348/538; 382/300, 254, 255; 396/128, 130; 359/319, 383
See application file for complete search history.

(56) References Cited

U.S. PATENT DOCUMENTS

| | | | |
|---|---|---|---|
| 8,149,324 B2* | 4/2012 | Oikawa | H04N 5/23212 250/231.16 |
| 2010/0073527 A1 | 3/2010 | Ichimiya | |

(Continued)

FOREIGN PATENT DOCUMENTS

| | | |
|---|---|---|
| JP | 2009-163229 A | 7/2009 |
| JP | 2010-062640 A | 3/2010 |

(Continued)

OTHER PUBLICATIONS

International Search Report for PCT/JP2013/083934, mailed on Mar. 18, 2014.

*Primary Examiner* — Tuan Ho
*Assistant Examiner* — Marly Camargo
(74) *Attorney, Agent, or Firm* — Birch, Stewart, Kolasch & Birch, LLP

(57) ABSTRACT

An image processing device includes a gain correction processing unit, an interpolation correction processing unit, an image processing unit. Within a range including a correction target phase difference detecting pixel and a plurality of capturing pixels adjacent to the correction target phase difference detecting pixel and detecting the same color as a color of the correction target phase difference detecting pixel, when a signal value obtained by correcting an output signal of the correction target phase difference detecting pixel using gain correction processing is Sc, in a case in which Sc<TH1 or Sc>TH2, the image processing unit records, in a recording medium, a signal obtained by correcting the output signal of the correction target phase difference detecting pixel by the interpolation correction processing unit.

9 Claims, 8 Drawing Sheets

(51) Int. Cl.
*H04N 5/369* (2011.01)
*H01L 27/146* (2006.01)
*H04N 5/378* (2011.01)
*G02B 7/34* (2006.01)
*H04N 5/376* (2011.01)
*H04N 9/04* (2006.01)

(52) U.S. Cl.
CPC ......... *H04N 5/23212* (2013.01); *H04N 5/357* (2013.01); *H04N 5/3696* (2013.01); *H04N 5/378* (2013.01); *H04N 9/045* (2013.01)

(56) References Cited

U.S. PATENT DOCUMENTS

2010/0150538 A1* 6/2010 Ono ....................... G03B 13/00
 396/104
2010/0214452 A1* 8/2010 Kawarada ............. G02B 7/346
 348/255
2010/0245631 A1 9/2010 Hoda et al.
2011/0085785 A1 4/2011 Ishii
2011/0109775 A1 5/2011 Amano
2012/0224087 A1 9/2012 Hoda et al.
2012/0236185 A1 9/2012 Ishii
2014/0347516 A1* 11/2014 Sano ....................... H04N 5/355
 348/230.1
2015/0062374 A1* 3/2015 Okazawa ................. G02B 7/34
 348/229.1

FOREIGN PATENT DOCUMENTS

| | | |
|---|---|---|
| JP | 2010-078856 A | 4/2010 |
| JP | 2011-081271 A | 4/2011 |
| JP | 2011-124704 A | 6/2011 |
| JP | 2012-004729 A | 1/2012 |

* cited by examiner

FIG. 2

IMAGE PROCESSING DEVICE, IMAGING DEVICE, IMAGE PROCESSING METHOD, AND NON-TRANSITORY COMPUTER READABLE MEDIUM

CROSS REFERENCE TO RELATED APPLICATION

This is a continuation of International Application No. PCT/JP2013/083934 filed on Dec. 18, 2013, and claims priority from Japanese Patent Application No. 2012-275944, filed on Dec. 18, 2012, the entire disclosures of which are incorporated herein by reference.

BACKGROUND

The present invention relates to an image processing device, an imaging device, an image processing method, and a non-transitory computer readable medium.

Recently, as the resolution of a solid-state imaging element such as a charge coupled device (CCD) image sensor and a complementary metal oxide semiconductor (CMOS) image sensor is enhanced, a demand for an information technology device having a photographing function such as a digital still camera, a digital video camera, a cellular phone such as a smartphone, and a personal digital assistant (PDA) is rapidly increasing. The information technology device having a capturing function as described above is referred to as an imaging device.

In such an imaging device, a contrast auto focus (AF) scheme or a phase difference AF scheme is employed as a focus control scheme which focuses on a major subject. Since the phase difference AF scheme may detect a focusing position with high precision at a high speed as compared to the contrast AF scheme, the phase difference AF scheme is widely employed in various imaging devices.

A solid-state imaging element mounted in an imaging device performing the focus control using the phase difference AF scheme uses, for example, a pair of phase difference detecting pixels having respective apertures of light shielding layers being off-centered in mutually reverse directions which are dispersedly provided on an entire surface of a capturing area (see Patent Literature 1 (JP-A-2012-4729) and Patent Literature 2 (JP-A-2010-62640)).

Since an area of the aperture of the light shielding layer in the phase difference detecting pixel is smaller than those of other general pixels, an output signal of the phase difference detecting pixel is inappropriate to be used as a captured image signal. Accordingly, the output signal of the phase difference detecting pixel needs to be corrected.

Patent Literature 1 and Patent Literature 2 disclose an imaging device simultaneously using interpolation correction processing of generating, through interpolation, an output signal of a phase difference detecting pixel using output signals of adjacent general pixels and gain correction processing of gain amplifying an output signal of a phase difference detecting pixel to be corrected.

SUMMARY

According to the gain correction processing disclosed in Patent Literatures 1 and 2, a gain value to be multiplied by the output signal of the phase difference detecting pixel needs to be obtained. Among manners of generating such a gain value, a manner of generating a gain value in advance from an image signal obtained by sensing a reference image, and a manner of generating a gain value in real time from an image signal obtained by sensing for a live-view image display are included.

However, in any of the aforementioned manners of generating gain values, the output signal of the phase difference detecting pixel may vary due to a pattern of a subject, noise, mixed colors, and the like.

A gain value used in the gain correction processing is not generated for each phase difference detecting pixel for each photographing condition, and a representative value is generated for each block obtained by segmenting a light receiving area of an imaging element. Since such a gain value generated for each block is an approximate value, an unnatural difference may occur between an output of a phase difference detecting pixel after the gain correction processing and outputs of photographing pixels adjacent to the phase difference detecting pixel.

In particular, in the case that a gain value is obtained to be used for the gain correction processing from the image signal for a live-view image display, for example, a difference in a brightness between the phase difference detecting pixel and a general pixel may occur. That is, since a gain value is determined based on an image pattern of a live-view image within a block, the gain value may vary. In addition, a signal value of the phase difference detecting pixel after the gain correction processing varies by multiplying a variation of a signal value of an original phase difference detecting pixel by a variation of the gain value. Accordingly, an output signal value of the phase difference detecting pixel after the gain correction processing may deviate from a desired value. In other words, the precision of the gain correction processing may change.

In general, although the gain correction processing is performed in vicinity of an edge portion of an image in which luminance or a color of the image radically changes, a difference between an output signal value after the gain correction processing and output signal values of adjacent pixels is insignificant.

On the other than, due to a recent trend of pixel refinement of an imaging element, a significant difference is noted between an output signal value after the gain correction processing and output signals of adjacent pixels. In detail, in an imaging element emitting light on a reverse surface thereof, an effect of mixed colors is noticeable, and with a growing influence of mixed colors, an effect of mixed colors on a gain value is increased, thereby increasing the variation in the gain value.

Thus far, image quality degradation caused by a variation of a gain value has been considered to be tolerable since a diaphragm and an imaging element are relatively small, a light angle incident on an imaging element is relatively moderate, and a depth of a field (DOF) is relatively shallow. However, when a size of an imaging element is increased and a diaphragm in a lens is open, a light angle is increased, whereby a variation of a gain value is increased. Thus, a difference between an output signal value after the gain correction processing and output signals of adjacent pixels is no longer tolerable.

In an imaging device having an optical low pass filter (OLPF) mounted therein, a spatial high frequency component is cut, and thus the aforementioned image quality degradation effect is minimal. In these days, however, an imaging device without an OLPF mounted therein is being suggested, and in such an imaging device, a variation of a gain value is significant.

In view of above, illustrative aspects of the present invention enhance correction precision of an output signal of a phase difference detecting pixel to thereby enhance capturing quality.

An aspect of the present invention provides an image processing device that processes a captured image signal output from an imaging element including a plurality of capturing pixels and a plurality of phase difference detecting pixels, the image processing device comprising: a gain correction processing unit that performs gain correction processing of correcting an output signal of the phase difference detecting pixel included in the captured image signal by multiplying the output signal by a gain value; an interpolation correction processing unit that performs interpolation correction processing of correcting the output signal of the phase difference detecting pixel included in the captured image signal by replacing the output signal with a signal generated based on output signals of capturing pixels adjacent to the phase difference detecting pixel and detecting the same color as a color of the phase difference detecting pixel; and an image processing unit that corrects each output signal of the plurality of phase difference detecting pixels included in the captured image signal using one of the gain correction processing unit and the interpolation correction processing unit, and record the captured image signal after the correction in a recording medium, wherein within a range including a correction target phase difference detecting pixel and a plurality of capturing pixels adjacent to the correction target phase difference detecting pixel and detecting the same color as a color of the correction target phase difference detecting pixel, when a minimum value is Smin, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel using the gain correction processing unit is Sc among the output signals of the capturing pixels, in a case in which Sc<TH1 or Sc>TH2, the image processing unit records, in the recording medium, a signal obtained by correcting the output signal of the correction target phase difference detecting pixel using the interpolation correction processing unit, and the first and second values are based on a value of the output signal of the correction target phase difference detecting pixel and the gain value.

Another aspect of the present invention provides an imaging device comprising: the image processing device; and the imaging element.

Another aspect of the present invention provides an image processing method of processing a captured image signal output from an imaging element including a plurality of capturing pixels and a plurality of phase difference detecting pixels, the image processing method comprising: an image processing step of correcting an output signal of the phase difference detecting pixel included in the captured image signal captured by the imaging element through one of gain correction processing of performing a correction by multiplying the output signal by a gain value and interpolation correction processing of performing a correction by replacing the output signal with a signal generated based on output signals of capturing pixels adjacent to the phase difference detecting pixel and detecting the same color as a color of the phase difference detecting pixel, and of recording the captured image signal after the correction in a recording medium, wherein within a range including a correction target phase difference detecting pixel and a plurality of capturing pixels adjacent to the correction target phase difference detecting pixel and detecting the same color as a color of the correction target phase difference detecting pixel, when a minimum value is Smin, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel through the gain correction processing is Sc among the output signals of the capturing pixels, in a case in which Sc<TH1 or Sc>TH2, the image processing operation step includes recording, in the recording medium, a signal obtained by correcting the output signal of the correction target phase difference detecting pixel through the interpolation correction processing, and the first and second values are based on a value of the output signal of the correction target phase difference detecting pixel and the gain value.

Another aspect of the present invention provides a non-transitory computer readable medium storing an image processing program causing a computer to perform processing a captured image signal output from an imaging element including a plurality of capturing pixels and a plurality of phase difference detecting pixels, the processing comprising: an image processing step of correcting an output signal of the phase difference detecting pixel included in the captured image signal captured by the imaging element through one of gain correction processing of performing a correction by multiplying the output signal by a gain value and interpolation correction processing of performing a correction by replacing the output signal with a signal generated based on output signals of capturing pixels adjacent to the phase difference detecting pixel and detecting the same color as a color of the phase difference detecting pixel, and of recording the captured image signal after the correction in a recording medium, wherein within a range including a correction target phase difference detecting pixel and a plurality of capturing pixels adjacent to the correction target phase difference detecting pixel and detecting the same color as a color of the correction target phase difference detecting pixel, when a minimum value is Smin, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel through the gain correction processing is Sc among the output signals of the capturing pixels, in a case in which Sc<TH1 or Sc>TH2, the image processing operation step includes recording, in the recording medium, a signal obtained by correcting the output signal of the correction target phase difference detecting pixel through the interpolation correction processing, and the first and second values are based on a value of the output signal of the correction target phase difference detecting pixel and the gain value.

Any one of the aspects of the present invention are directed to an image processing device capable of enhancing correction precision of an output signal of a phase difference detecting pixel to thereby enhance capturing quality, an imaging device including the same, an image processing method, and an image processing program.

BRIEF DESCRIPTION OF DRAWINGS

FIG. 2 is a plan view illustrating a schematic configuration of a solid-state imaging element 5 mounted in the digital camera illustrated in FIG. 1.

DESCRIPTION OF EMBODIMENTS

Hereinafter, an embodiment of the present invention will be more clearly understood from the following description taken in conjunction with the accompanying drawings.

Figure 1:
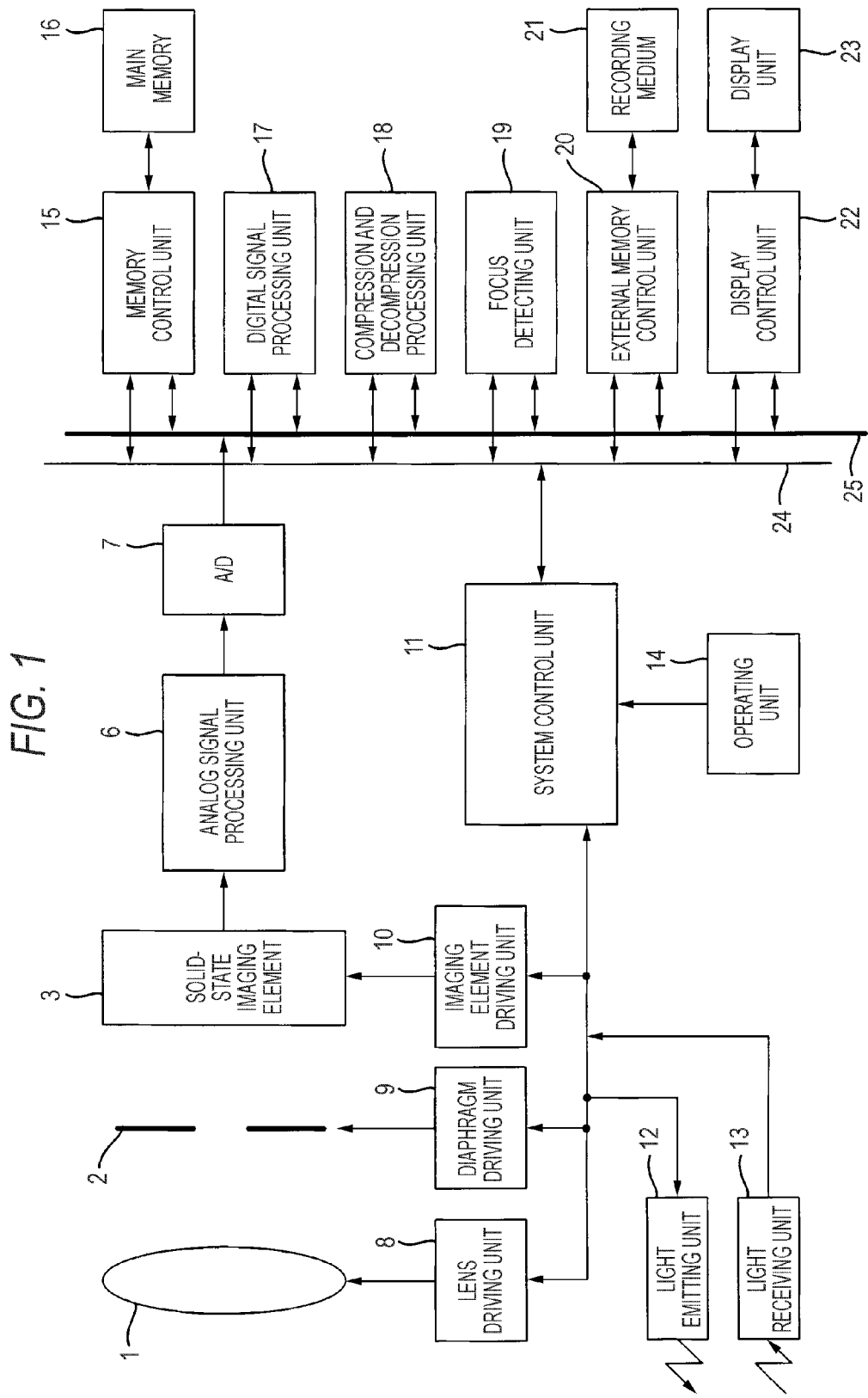
FIG. 1 is a diagram illustrating a schematic configuration of a digital camera as an example of an imaging device for describing an embodiment of the present invention.

FIG. 1 is a diagram illustrating a schematic configuration of a digital camera as an example of an imaging device for describing an embodiment of the present invention.

A capturing system of a digital camera illustrated in FIG. 1 includes a photographing optical system having a photographing lens 1 including a focus lens, a zoom lens, or the like, and a diaphragm 2, and a solid-state imaging element 3 such as a charge coupled device (CCD) image sensor, a complementary metal oxide semiconductor (CMOS) image sensor, or the like.

The solid-state imaging element 3 is configured to include a plurality of capturing pixels and two different phase difference detecting pixels respectively receiving a pair of luminous fluxes which have passed through a different pupil area of the photographing optical system, which are two-dimensionally arranged. The solid-state imaging element 3 receives an image captured by the photographing lens 1 to output a captured image signal and output a pair of image signals corresponding to the pair of luminous fluxes.

A system control unit 11 collectively controlling an entire electrical control system of the digital camera controls a flash light emitting unit 12 and a light receiving unit 13. Further, the system control unit 11 controls a lens driving unit 8 to adjust a position of the focus lens included in the photographing lens 1 or a position of the zoom lens included in the photographing lens 1. Moreover, the system control unit 11 controls an aperture size of the diaphragm 2 through a diaphragm driving unit 9 to adjust an exposure amount.

In addition, the system control unit 11 drives the solid-state imaging element 3 using an imaging element driving unit 10, and outputs a subject image captured through the photographing lens 1 as a captured image signal. An instruction signal from a user is input to the system control unit 11 using an operating unit 14.

The electrical control system of the digital camera further includes an analog signal processing unit 6 connected to an output of the solid-state imaging element 3 to perform an analog signal processing such as a correlated double sampling processing and an analog-to-digital (A/D) converting circuit 7 converting red, green, and blue (RGB) color signals output from the analog signal processing unit 6 into digital signals. The analog signal processing unit 6 and the A/D converting circuit 7 are controlled by the system control unit 11.

Moreover, the electrical control system of the digital camera includes a main memory 16, a memory control unit 15 connected to the main memory 16, a digital signal processing unit 17 performing various types of image processing on a captured image signal by the solid-state imaging element 3 to generate photographed image data, a compression and decompression processing unit 18 compressing the captured image data generated in the digital signal processing unit 17 in a Joint Photographic Experts Group (JPEG) format or decompressing the compressed image data, a focus detecting unit 19 calculating a defocus amount of the photographing lens 1 based on a phase difference in a pair of image signals output from a phase difference detecting pixel of the solid-state imaging element 3, an external memory control unit 20 to which a detachable recording medium 21 is connected, and a display control unit 22 to which a display unit 23 mounted on a rear surface of a camera is connected. The memory control unit 15, the digital signal processing unit 17, the compression and decompression processing unit 18, the focus detecting unit 19, the external memory control unit 20, and the display control unit 22 are connected to one another through a control bus 24 and a data bus 25 to be controlled by a command from the system control unit 11.

Figure 2:
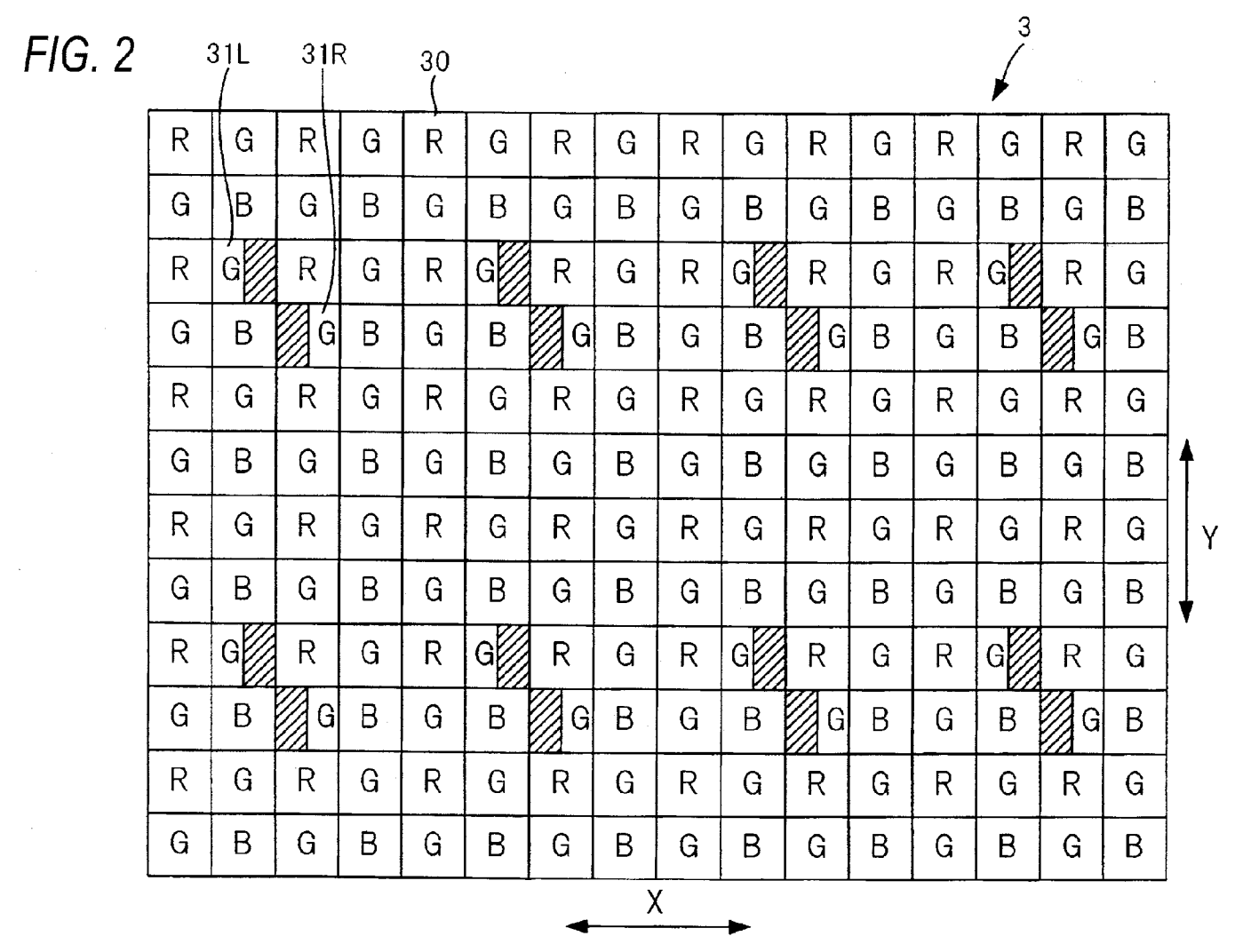

FIG. 2 is a plan view illustrating a schematic configuration of the solid-state imaging element 3 mounted in the digital camera illustrated in FIG. 1. The solid-state imaging element 3 includes phase difference detecting pixels dispersedly provided in the entirety or a portion of a capturing area in which pixels are two-dimensionally arranged. FIG. 2 is an enlarged view of the portion of the capturing area in which the phase difference detecting pixels are provided.

The solid-state imaging element 3 includes a plurality of pixels (square blocks in FIG. 2) two-dimensionally (a square lattice pattern in FIG. 2) arranged in a row direction X and a column direction Y, which is perpendicular to the row direction X. The plurality of pixels are arranged in a manner that a plurality of pixel rows each including a plurality of pixels which are lined up in the row direction X at predetermined pitches are lined up in the column direction Y at predetermined pitches. The plurality of pixels include a capturing pixel 30, a phase difference detecting pixel 31L, and a phase difference detecting pixel 31R. Each of the pixels includes a photoelectric converting unit receiving light to convert light into charges.

The capturing pixel 30 is a pixel receiving both of a pair of luminous fluxes which have passed through a different pupil area of the photographing lens 1 illustrated in FIG. 1, for example, a luminous flux having passed through a left side of the photographing lens 1 and a luminous flux having passed through a right side of the photographing lens 1 with respect to a main axis of the photographing lens 1. The phase difference detecting pixel 31L receives one of the pair of luminous fluxes, and is configured in a manner in which an aperture (an area of the pixel not indicated by hatching) of the photoelectric converting unit is off-centered to the left, as compared to the capturing pixel 30.

The phase difference detecting pixel 31R receives the other of the pair of luminous fluxes, and is configured in a manner in which an aperture (an area of the pixel not indicated by hatching) of the photoelectric converting unit is off-centered to the right, as compared to the capturing pixel 30.

In addition, the configuration of the phase difference detecting pixel is not limited to the above description, and other well-known configurations may be employed. Although it is exemplified herein that a pair of phased image signals having a phase difference in the row direction X are detected by the phase difference detecting pixel 31R and the phase difference detecting pixel 31L, an off-centered direction of the aperture of the light shielding layer may also be the column direction Y, and a pair of phased image signals having a phase difference in the column direction Y may be detected.

The photoelectric converting unit included in each pixel has a color filter mounted thereon, and the color filters are arranged in a Bayer pattern in all of the plurality of pixels constituting the solid-state imaging element 3.

In FIG. 2, a pixel including a color filter transmitting a red (R) light component mounted thereon is denoted by a reference character "R", a pixel including a color filter transmitting a green (G) light component mounted thereon is denoted by a reference character "G", and a pixel including a color filter transmitting a blue (B) light component mounted thereon is denoted by a reference character "B". The color of the color filter may include four or more colors.

The phase difference detecting pixel 31L is disposed at a position of a pixel including a color filter transmitting green G light mounted thereon, at intervals of three pixels in the third and ninth pixel rows from top with reference to FIG. 2.

The phase difference detecting pixel 31R is disposed at a position of a pixel including a color filter transmitting green G light mounted therein, at intervals of three pixels in the fourth and tenth pixel rows from top with reference to FIG. 2.

A phase difference detecting pixel 31L and a phase difference detecting pixel 31R which are diagonally adjacent to one another form a pixel pair, and the solid-state imaging element 3 is configured to include a plurality of such pixel pairs.

The focus detecting unit 19 illustrated in FIG. 1 uses a signal group read out from the phase difference detecting pixel 31L and the phase difference detecting pixel 31R to calculate a focus adjusted state of the photographing lens 1, in this case, an amount and a direction of a focus by and in which the photographing lens 1 deviates from a focused state, that is a defocus amount.

The system control unit 11 illustrated in FIG. 1 controls a position of a focus lens included in the photographing lens 1 to adjust a focus based on the defocus amount calculated by the focus detecting unit 19.

When an instruction to photograph is received in a state in which the focus is adjusted, the system control unit 11 captures an image using the solid-state imaging element 3, and thereby a captured image signal (a group of output signals output from respective pixels) output from the solid-state imaging element 3 is transmitted to be received by the digital signal processing unit 17.

The digital signal processing unit 17 corrects an output signal of a phase difference detecting pixel included in the captured image signal, and records the captured image signal after the correction in the main memory 16. In addition, the digital signal processing unit 17 performs an image processing on the recorded captured image signal, and generates captured image data. Among the image processing, a demosaic processing, a gamma (γ) correction processing, a white balance adjustment processing, and the like, are included.

Figure 3:
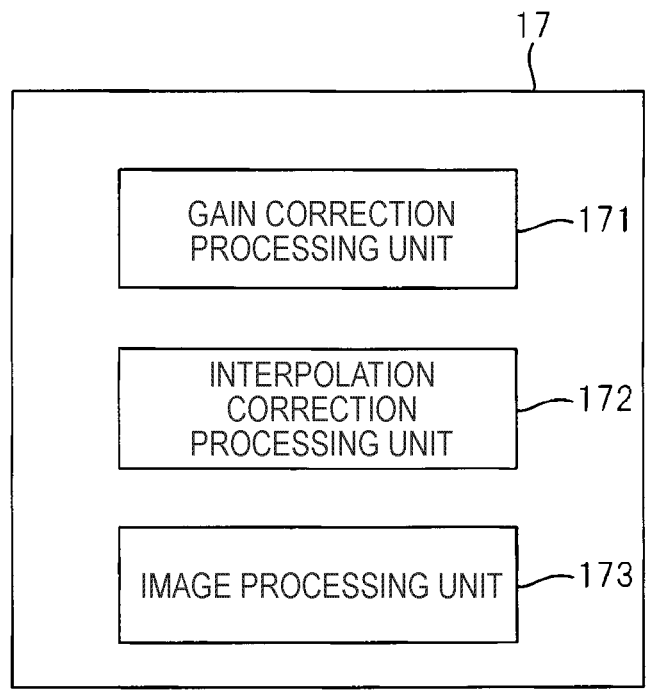
FIG. 3 is a functional block diagram illustrating a digital signal processing unit 17 in the digital camera illustrated in FIG. 1.

FIG. 3 is a functional block diagram illustrating the digital signal processing unit 17 in the digital camera illustrated in FIG. 1.

The digital signal processing unit 17 includes a gain correction processing unit 171, an interpolation correction processing unit 172, and an image processing unit 173. The gain correction processing unit 171, the interpolation correction processing unit 172, and the image processing unit 173 are functional blocks formed by a processor executing a program, the processor included in the digital signal processing unit 17.

The gain correction processing unit 171 performs gain correction processing of correcting an output signal of a phase difference detecting pixel targeted to be corrected (hereinafter, referred to as a correction target pixel) which is included in a captured image signal by multiplying the output signal by a gain value.

The gain value is obtained from the captured image signal which is captured by the solid-state imaging element 3. The captured image signal may be obtained by sensing a reference image during an adjustment process prior to shipment of a digital camera, or may be obtained by sensing for a live-view image display.

For example, an area in which phase difference detecting pixels are arranged is divided into a plurality of blocks. For each block, an average value AvS of output signals of capturing pixels 30 detecting a green color in the corresponding block is calculated, an average value AvL of output signals of the phase difference detecting pixels 31L in the corresponding block is calculated, and AvS/AvL is calculated as a gain value corresponding to the phase difference detecting pixel 31L in the corresponding block to be stored in a memory.

Similarly thereto, for each block, the average value AvS of the output signals of the capturing pixels 30 detecting the green color in the corresponding block is calculated, an average value AvR of output signals of the phase difference detecting pixels 31R in the corresponding block is calculated, and AvS/AvR is calculated as a gain value corresponding to the phase difference detecting pixel 31R in the corresponding block to be stored in the memory.

The gain correction processing unit 171 performs the gain correction processing by reading out a gain value corresponding to the correction target pixel from the memory and multiplying the output signal of the correction target pixel by the gain value.

The interpolation correction processing unit 172 performs the interpolation correction processing by replacing the output signal of the correction target pixel with a signal generated based on output signals of capturing pixels 30 adjacent to the correction target pixel and detecting the same color as a color of the correction target pixel.

The interpolation correction processing includes a maximum/minimum substitution processing and an averaging correction processing (a calculation correction processing).

The maximum/minimum substitution processing is processing of substituting the output signal of the correction target pixel with duplicate data of one of a minimum value Smin and a maximum value Smax of output signals of a plurality of capturing pixels 30 detecting the same color as a color of the correction target pixel in a range including the plurality of capturing pixels 30 within a predetermined range centered on the correction target pixel on a light receiving surface of the solid-state imaging element 3.

Hereinafter, in the maximum/minimum substitution processing, processing of substituting the output signal of the correction target pixel with the minimum value Smin is referred to as a minimum substitution processing, and processing of substituting the output signal of the correction target pixel with the maximum value Smax is referred to as a maximum substitution processing.

The averaging correction processing is processing of replacing the output signal of the correction target pixel with a signal generated by a calculation using the output signals of the plurality of capturing pixels 30 adjacent to the target correction pixel and detecting the same color as the color of the correction target pixel within the aforementioned predetermined range.

Figure 4:
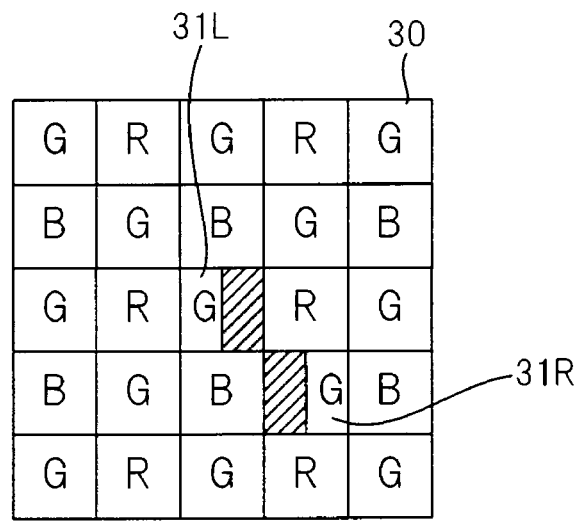
FIG. 4 is a view illustrating an example in which 5×5 number of pixels centered on a phase difference detecting pixel 31L are extracted from the solid-state imaging element 3 illustrated in FIG. 2.

For example, in a predetermined range including 5×5=25 number of pixels centered on the phase difference detecting pixel, in a case in which an output signal of a phase difference detecting pixel 31L disposed in the center of the 25 pixels illustrated in FIG. 4 is corrected by the averaging correction processing, a value of the output signal of the phase difference detecting pixel 31L in the center is substituted by an average value of output signals of eleven capturing pixels 30 adjacent to the phase difference detecting pixel 31L in the center and detecting green G light.

The image processing unit 173 corrects an output signal for each correction target pixel using one of the gain correction processing unit 171 and the interpolation correction processing unit 172, and records, in the main memory 16, a captured image signal after the correction being performed with respect to all of the correction target pixels. The image processing unit 173 performs an imaging processing on the recorded captured image signal to generate captured image data, and records the captured image data in the recording medium 21. In addition, the image processing unit 173 may record the captured image signal after the correction being performed with respect to the output signals of all of the correction target pixels as RAW data in the recording medium 21.

Figure 5:
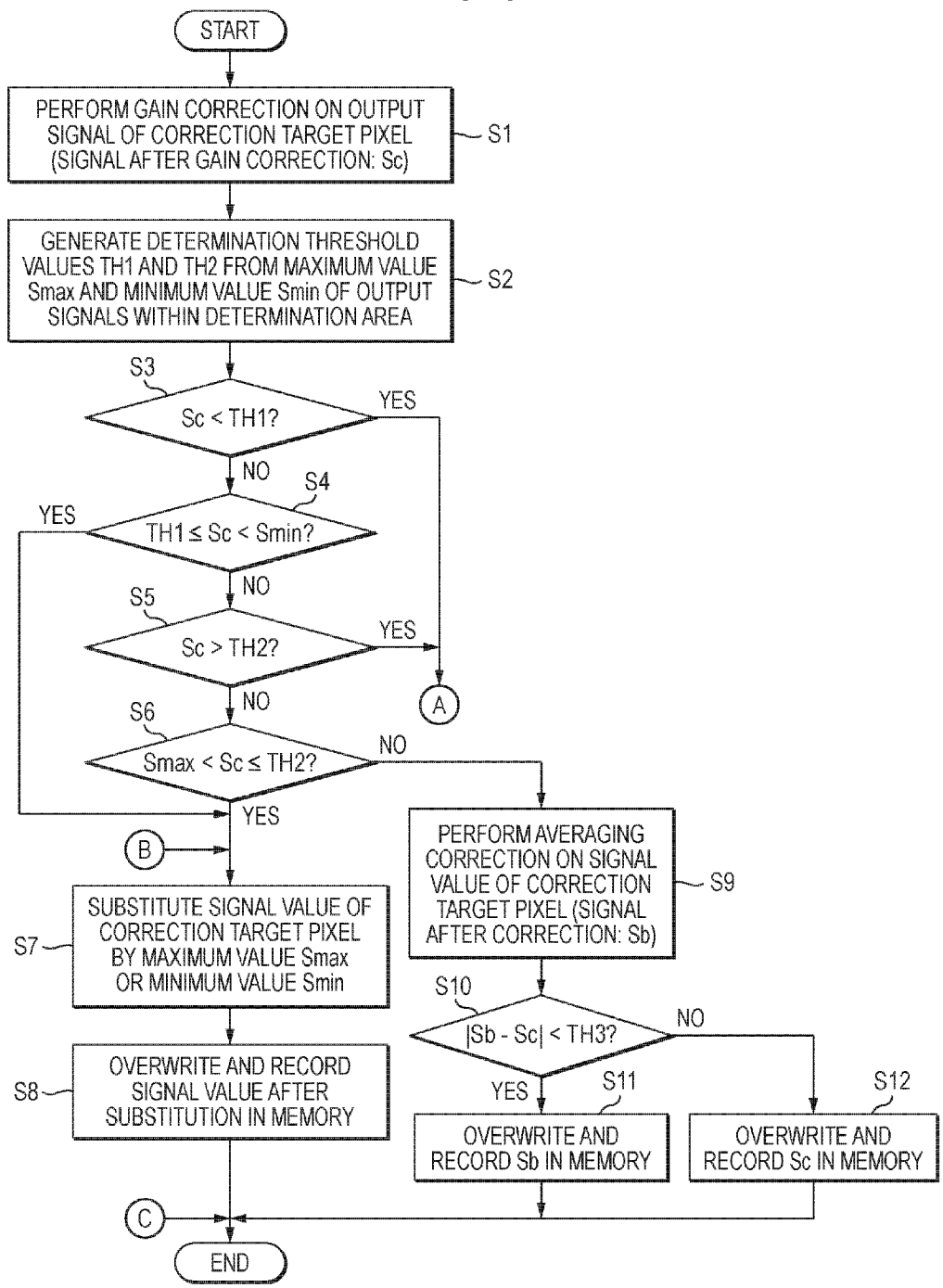
FIG. 5 is a flowchart illustrating an operation of the digital signal processing unit 17 in the digital camera illustrated in FIG. 1.
Figure 6:
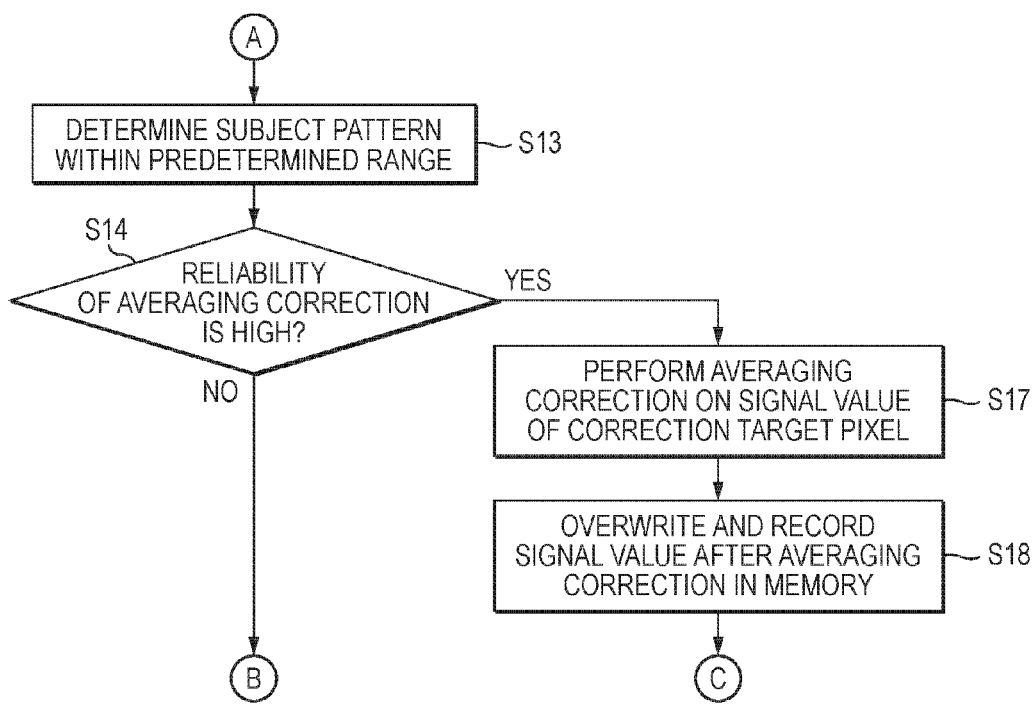
FIG. 6 is a flowchart illustrating an operation of the digital signal processing unit 17 in the digital camera illustrated in FIG. 1.

FIGS. 5 and 6 are flowcharts illustrating an operation in which the image processing unit 173 illustrated in FIG. 3 corrects an output signal of a predetermined correction target pixel.

When the solid-state imaging element 3 captures an image to record the image, a captured image signal output from the solid-state imaging element 3 is stored in the main memory 16. When the captured image signal is stored, the image processing unit 173 obtains, from the main memory 16, output signals of all pixels centered on a predetermined correction target pixel within a predetermined range in the solid-state imaging element 3. The predetermined range may include the correction target pixel and a plurality of capturing pixels adjacent to the correction target pixel and detecting the same color as a color of the correction target pixel.

In step S1, the image processing unit 173 corrects an output signal of the correction target pixel from among the obtained output signals, through the gain correction processing unit 171. As used herein, a value of the output signal obtained by correcting through the gain correction processing unit 171 is referred to as Sc.

The image processing unit 173 extracts a maximum value and a minimum value of output signals of capturing pixels 30 detecting the same color as a color of the correction target pixel from among the obtained output signals. The extracted maximum value is denoted by Smax and the extracted minimum value is denoted by Smin.

In step S2, the image processing unit 173 generates a determination threshold value TH1 by subtracting a predetermined value "a" from the minimum value Smin, and generates a determination threshold value TH2 by adding the predetermined value "a" to the maximum value Smax.

The determination threshold values TH1 and TH2 are threshold values for determining a reliability of the value of the output signal Sc obtained in step S1. A contrast of a subject within the predetermined range is obtained from the minimum value Smin and the maximum value Smax within the predetermined range. That is, when the value of the output signal obtained in step S1 is between the minimum value Smin and the maximum value Smax, the value of the output signal is determined to have a relatively high reliability.

As described above, for the gain value used in the gain correction processing, a common value is generally applied with respect to all phase difference detecting pixels having the same structure within a single block. However, the output signal of the phase difference detecting pixel within the block has a variation. Accordingly, the value of the output signal obtained by the gain correction processing in step S1 may be decreased to be smaller than the minimum value Smin or may be increased to be greater than the maximum value Smax, that is, may be increased or decreased by a value of the variation. Thus, a variation of the gain value caused by the variation of the value of the output signal after the gain correction processing is provided as the predetermined value "a" in advance. The variation value "a", which is determined by a noise performance, and the like, of the solid-state imaging sensing element 3, is obtained in advance by sensing a reference image, or the like.

Hereinafter, a manner of obtaining the variation value "a" will be described further detail.

A reference image, for example, a beta image of solid green, solid grey, solid black, and the like, is photographed to obtain a gain value for each block from a ratio of an output signal of each phase difference detecting pixel 31R to an output signal of an adjacent imaging sensing pixel 31 within the block.

A variation value "a" obtained with respect to a predetermined block is given Equation 1.

$$a = \sqrt{\left[\sum_{k=1}^{n} \{(Sk \times G) - S_{AV}\}^2\right]/n} \qquad \text{[Equation 1]}$$

$$S_{AV} = \left\{\sum_{k=1}^{n} (Sk \times G)\right\}/n$$

S1 through Sn denote the output signal of the phase difference detecting pixel 31R within the block, and G denotes the gain value generated with respect to the block.

Such processing of generating the variation value "a" of the gain value is also performed even in a case in which an F value and the International Standards Organization (ISO) film speed are changed. For example, a variation value "a" is generated in advance in each case of F2 and F4, and in a case of F3.5, a variation value "a" is obtained using an interpolation scheme. A table storing the variation value "a" is created for each combination of the ISO film speed and the F value obtained as described above. Creating the table is also performed with respect to a phase difference detecting pixel 31L, which has a structure different from that of the phase difference detecting pixel 31R.

In a case of mixing pixels, obtaining a variation value "a" in advance may be useful. For example, in a case of mixing four pixels, three pixels which are capturing pixels 30 and the other pixel which is a phase difference detecting pixel 31R may be mixed, a gain value is obtained with respect to a signal after the mixing of the four pixels, and a variation value "a" is obtained from the gain value in advance.

The image processing unit 173 adds the variation value "a" corresponding to set photographing conditions, such as an F value, the ISO film speed, and pixel mixture driving, to the maximum value Smax so as to generate the determination threshold value TH2, and subtracts the variation value "a" from the minimum value Smin so as to generate the determination threshold value TH1 in step S2.

In lieu of using the reference image, the variation value "a" may also be obtained using a captured image signal for a live-view image. In this case, since a variation value in actual photographing conditions, for example, an F value, may be obtained, a precise value may be obtained herein with respect to the photographing conditions.

Although the manner of obtaining the gain value for each block has been described thus far, the gain value may also be obtained for each phase difference detecting pixel. In this case, a gain value G to be multiplied by Sk in Equation 1 may use a gain value generated with respect to a phase difference detecting pixel, which is an output source of Sk.

In addition, the variation value "a" for each photographing condition may be adjusted based on a brightness of a subject. For example, in a case in which a subject image within a predetermined block is relatively bright, photon shot noise is increased. Due to being abruptly generated noise, photon shot noise is not reflected in the variation value "a" obtained in advance from a reference image. Accordingly, in the case of the relatively bright subject, the variation value "a" may be set to be relatively great, such that a determination threshold value reflecting effects of photon shot noise is generated. Further, the variation value "a" may be adjusted for each block by determining a brightness of a subject for each block, or a brightness of a subject may be determined with respect to an entire block and the variation value "a" may be collectively adjusted with respect to the entire block based on the brightness. In a case of a relatively dark subject, the variation value "a" may be set to be relatively small.

In the above description, the variation value added to the maximum value Smax to obtain the determination threshold value TH2 and the variation value subtracted from the minimum value Smin to obtain the determination threshold value TH2 are set to have the same value; however, the variation values may be set to have different values.

For example, in a case in which a subject is dark overall and a grey scale is not adjusted, a black spot is difficult to be seen, and thus, a reliability in a case of a relatively great output signal value Sc is increased. Accordingly, in this case, the determination threshold value TH2 is increased while the determination threshold value TH1 is maintained.

Conversely, in a case in which a subject is relatively bright overall and a grey scale is not adjusted, a white spot is difficult to be seen, and thus, a reliability in a case of a relatively small output signal value Sc is increased. Accordingly, in this case, the determination threshold value TH1 is decreased while the determination threshold value TH2 is maintained.

Even in a case in which the output signal value Sc obtained in step S1 deviates from the range from the minimum value Smin to the maximum value Smax, when the output signal value Sc is in a range from the minimum value Smin to the determination threshold value TH1, or when the output signal value Sc is in a range from the maximum value Smax to the determination threshold value TH2, it is appreciated that a signal value after the correction deviates from the range from the minimum value Smin to the maximum value Smax due to noise included in an output signal prior to the correction. Accordingly, in this case, it is determined that a reliability of the output signal value Sc is not particularly low.

Meanwhile, in a case in which TH1>Sc or Sc>TH2, it is determined that the signal value prior to the gain correction processing has an abnormality or the gain value itself is inappropriate, and thus, a reliability of Sc is determined to be relatively low.

In this regard, after step S2, the image processing unit 173 performs processing as follows.

In step S3, the image processing unit 173 compares the signal value obtained in step S1 with the determination threshold value TH1. The image processing unit 173 performs step S13 in FIG. 6 in a case in which Sc<TH1, and performs step S4 in FIG. 5 in a case in which Sc TH1.

In step S4, the image processing unit 173 compares the signal value Sc and the determination threshold value TH1 with the minimum value Smin. The image processing unit 173 performs step S7 in FIG. 5 in a case in which TH1 Sc<Smin, and performs step S5 in FIG. 5 in a case in which Sc Smin.

In step S5, the image processing unit 173 compares the signal value Sc with the determination threshold value TH2. The image processing unit 173 performs step S13 in FIG. 6 in a case in which Sc>TH2, and performs step S6 in FIG. 5 in a case in which Sc TH2.

In step S6, the image processing unit 173 compares the signal value Sc and the determination threshold value TH2 with the maximum value Smax. The image processing unit 173 performs step S7 in FIG. 5 in a case in which Smax<Sc≤TH2, and performs step S9 in FIG. 5 in a case in which Sc<Smax.

In step S7, the image processing unit 173 corrects the output signal of the obtained correction target pixel through the maximum/minimum substitution processing using the interpolation correction processing unit 172. Here, the output signal of the correction target pixel is substituted by one of the minimum value Smin and the maximum value Smax which is closer to the output signal value Sc. That is, in the case in which TH1≤Sc<Sm in, the output signal of the correction target pixel is substituted by the minimum value Sm in, and in the case in which Smax<Sc≤TH2, the output signal of the correction target pixel is substituted by the maximum value Smax.

In step S8 after step S7, the image processing unit 173 overwrites and stores the signal after the correction in step S7 in an area of the main memory 16 in which the output signal of the correction target pixel is stored.

In a case of YES as a result of the determination in step S4 and YES as a result of the determination in step S6, the output signal value Sc is determined to deviate from the range from the minimum value Smin to the maximum value Smax due to a variation of a level of noise included in the output signal of the correction target pixel. In this regard, in lieu of steps S7 and S8, an operation of overwriting and storing the signal after the correction in step S1 in the area of the main memory 16 in which the output signal of the correction target pixel is stored may be provided.

In a case of performing steps S7 and S8, an effect of noise included in the output signal of the correction target pixel is reduced, and thereby an image quality enhancement effect is increased.

In step S9 which to be performed in a case of NO as a result of the determination in step S6, the image processing unit 173 corrects the output signal of the obtained correction target pixel by the averaging correction processing using the interpolation correction processing unit 172. A signal value obtained by the above averaging correction processing is denoted by Sb.

After step S9, the image processing unit 173 calculates a difference, that is, an absolute value irrespective of positive and negative signs, between the signal value Sc obtained in step S1 and the signal value Sb obtained in step S9.

In step S11, in a case in which the difference is less than a determination threshold value TH3, the image processing unit 173 overwrites and stores the signal Sb obtained in step S9 in the area of the main memory 16 in which the output signal of the correction target pixel is stored.

In step S12, in a case in which the difference is equal to or greater than the determination threshold value TH3, the image processing unit 173 overwrites and stores the signal Sc obtained in step S1 in the area of the main memory 16 in which the output signal of the correction target pixel is stored.

Between the averaging correction processing and the gain correction processing, in a case of an absence of a difference between the output signal and the signal after the correction, an image obtained after the correction by the averaging correction processing is determined to be more natural than an image obtained by correcting through the gain correction processing. Meanwhile, in the case of No as the result of the determination in step S6, between the averaging correction processing and the gain correction processing, in a case in which a relatively great difference is present between the output signal and the signal after the correction, image quality is highly likely to be degraded when the image is corrected by the averaging correction processing.

Accordingly, image quality may be enhanced by predetermining, as the determination threshold value TH3, a threshold value of the difference between the signal values Sb and Sc in a case in which such image quality degradation is not allowed, and then performing step S10. Also, in the case of No as the result of the determination in step S6, step S12 may be performed without performing steps S9 and S10.

In step S13 in FIG. 6, the image processing unit 173 determines a pattern of a subject captured based on the predetermined range using the output signal of the capturing pixel 30 within the predetermined range. For example, the image processing unit 173 determines whether the subject is a high frequency pattern or a low frequency pattern, whether an edge is included in the subject, and the like.

In step S14 in FIG. 6, the image processing unit 173 determines whether a reliability, that is, correction precision, of the averaging correction processing is high based on the pattern of the subject determined in step S13.

For example, in a case of the subject being a high frequency pattern, a pattern including an edge, a sharp pattern, and the like, when the averaging correction processing is performed, the output signal value after the correction is likely to be excessively increased or excessively decreased. Accordingly, the image processing unit 173 determines that a reliability of the averaging correction processing is low and performs step S7 in FIG. 5.

On the other hand, in a case of the subject being a low frequency pattern, a pattern without an edge, a blurred pattern, and the like, since a difference between a level of the output signal of the correction target pixel and a level of the output signal of the capturing pixel 30 adjacent to the correction target pixel is minimal, a reliability of the averaging correction processing is determined to be relatively high. Accordingly, in the case of having such patterns, the image processing unit 173 determines that a reliability of the averaging correction processing is relatively high and performs step S17 in FIG. 6. However, the manner of determining a reliability of the averaging correction processing is not limited to the above description.

In step S17, the image processing unit 173 corrects the obtained output signal of the correction target pixel by the averaging correction processing using the interpolation correction processing unit 172. In step S18, the image processing unit 173 overwrites and stores the signal value obtained after the correction in step S17 in the area of the main memory 16 in which the output signal of the correction target pixel is stored.

In addition, in a case in which steps S13 and S14 are omitted and a result of the determination in step S3 is YES and a result of the determination in step S5 is YES, step S17 may be performed. Even in the case of performing the averaging correction processing as in step S17, image quality may be enhanced as compared to the case of performing the gain correction processing.

Figure 7:
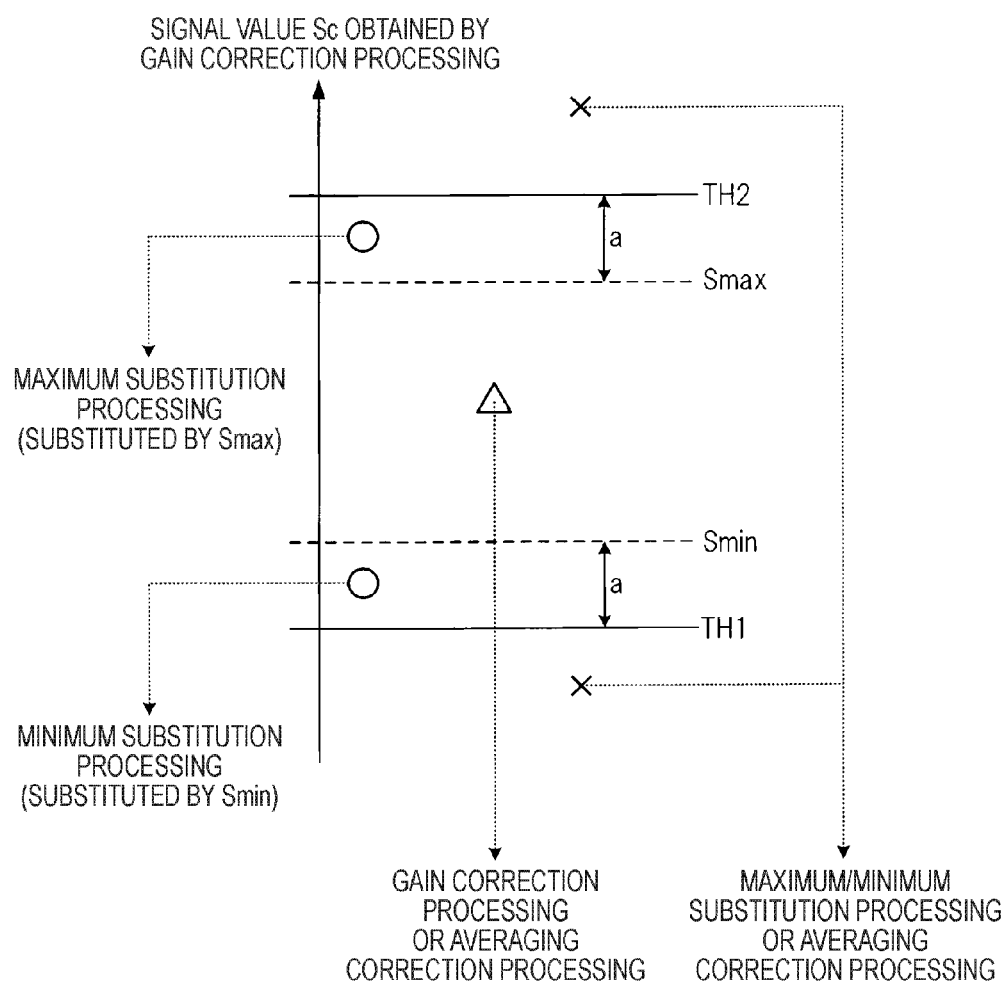
FIG. 7 is a view illustrating an operation of the digital signal processing unit 17 in the digital camera illustrated in FIG. 1.

The operations described thus far are illustrated in FIG. 7. As indicated by circular reference symbols in FIG. 7, in a case in which the signal value Sc is a value equal to and less than the determination threshold value TH2 and greater than the maximum value Smax, the output signal of the correction target signal is corrected by the maximum substitution processing, and the signal value after the correction is stored in the main memory 16. In addition, in a case in which the signal value Sc is a value equal to and greater than the determination threshold value TH1 and less than the minimum value Smin, the output signal of the correction target pixel is corrected by the minimum substitution processing, and the signal value after the correction is stored in the main memory 16.

In addition, as indicated by reference symbols "X" in FIG. 7, in a case in which the signal value Sc is greater than the determination threshold value TH2 or less than the determination threshold value TH1, one of the maximum or minimum substitution processing and the averaging correction processing is selected, corresponding to the pattern of the subject captured based on the predetermined range, the output signal of the correction target pixel is corrected by the selected processing, and the signal value after the correction is stored in the main memory 16.

In addition, as indicated by a triangular reference symbol in FIG. 7, in a case in which the signal value Sc is a value equal to and greater than Smin and less than Smax, one of the signal values Sb and Sc is stored in the main memory 16 based on a difference between the signal values Sb and Sc obtained by the averaging correction processing.

The digital signal processing unit 17 ends the correction processing of the output signal of the phase difference detecting pixel in the captured image signal by performing the operations illustrated in FIGS. 6 and 7 with respect to all of the correction target pixels. The captured image signal stored in the main memory 16 in the above state is data after the correction of the output signal of the phase difference detecting pixel.

As such, according to the digital camera illustrated in FIG. 1, the signal value to be ultimately stored in the main memory 16 is determined whether to be corrected by the gain correction processing unit 171 or the interpolation correction processing unit 172, based on the level of the signal value Sc obtained by correcting the output signal of the correction target pixel through the gain correction processing.

For example, in a case in which the signal value Sc is above TH2 or below TH1, the signal value after the correction which is to be stored in the main memory 16 is not the signal value corrected by the gain correction processing, and thus, a reliability of the signal value after the correction may be increased.

In addition, according to the digital camera illustrated in FIG. 1, the signal value to be ultimately stored in the main memory 16 is determined whether to be corrected by the gain correction processing unit 171 or the interpolation correction processing unit 172, based on the level of the signal value Sc obtained by correcting the output signal of the correction target pixel through the gain correction processing. Therefore, coordinates data of a faulty pixel is not required to be stored in the digital camera, and even an issue in which the phase difference detecting pixel changes to be a faulty pixel while in use due to any reasons may be addressed.

In particular, the predetermined range may be set to include the capturing pixel 30 detecting the same color as the color of the correction target pixel and being present in right, left, upper, lower, upper right diagonal, lower left diagonal, upper left diagonal, and lower right diagonal directions with respect to the correction target pixel.

Figure 8:
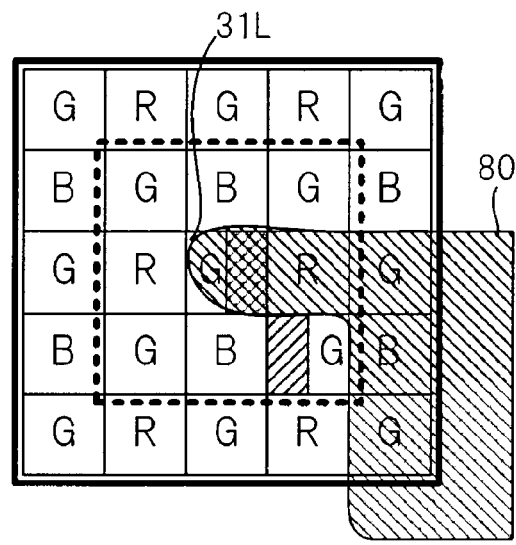
FIG. 8 is a view illustrating an example of a predetermined range.

FIG. 8 is a view illustrating an enlarged portion of the solid-state imaging element 3 illustrated in FIG. 2. Referring to FIG. 8, the aforementioned predetermined range is illustrated as including nine pixels enclosed by dashed lines. In this case, in a presence of a relatively dark subject as indicated by reference numeral 80, an actual signal value at a position of a correction target pixel 31L corresponds to the dark subject.

However, a signal value of the correction target pixel 31L obtained by the averaging correction processing within the range indicated by the dashed lines is obtained by a calculation using output signals of capturing pixels 30 not overlapping the subject 80, that is, three capturing pixels 30 in upper right, upper left, and lower left directions with respect to the correction target pixel 31L, such that an error with respect to the actual signal value is increased.

In addition, a signal value of the correction target pixel 31L obtained by the maximum/minimum correction processing within the range indicated by dashed lines is one of the output signals of the capturing pixels 30 not overlapping the subject 80, such that an error with respect to the actual signal value is increased.

Accordingly, when the range indicated by dashed lines is set to be the predetermined range, a correction error by the interpolation correction processing unit 172 is increased. Such an increase in the correction error is caused because a portion of the subject 80 included in the predetermined range does not pass through a capturing pixel 30 detecting the same color as a color of the correction target pixel 31L until the subject 80 reaches the correction target pixel 31L within the predetermined range.

Accordingly, in the case in which the subject 80 overlaps the correction target pixel 31L, the increase in the correction error may be prevented by increasing a probability in which the subject 80 overlaps the capturing pixel 30 detecting the same color as the color of the correction target pixel 31L within the predetermined range.

For example, in a case in which a range including 25 pixels enclosed by bold solid line in FIG. 8 is set to be the predetermined range, despite a presence of the subject 80 approaching from any of right, left, upper, lower, upper right diagonal, lower left diagonal, upper left diagonal, and lower right diagonal directions with respect to the correction target pixel 31L, the correction error of the interpolation correction processing may be reduced.

Although the present invention has been described above by the specific embodiments, the present invention is not limited to the embodiments but various modifications may be allowed without departing from a technical spirit of the disclosed invention.

For example, the pixel arrangement of the solid-state imaging element 3 including the phase difference detecting pixel and the capturing pixel is not limited to the illustrated example in FIG. 2, and other known arrangements may be employed.

Although the detection color of the phase difference detecting pixel is green as provided hereinbefore by way of example, the detection color may also be red or blue. In addition, the solid-state imaging element 3 may use a monochrome imaging device. In other words, a color filter may be omitted in the solid-state imaging element 3. Further, in a case of a color filter being mounted thereon, any color filter applicable to the imaging element, for example, a color filter having a complementary color, and the like, may be used.

The steps illustrated in FIGS. 5 and 6 performed by the digital signal processing unit 17 may be provided as a program to be executed in a computer. Such a program is recorded in a computer-readable non-transitory recording medium.

The computer-readable non-transitory recording medium includes an optical medium such as a compact disc-read only memory (CD-ROM), or a magnetic recording medium such as a memory card. In addition, the program may be provided by downloading through a network.

Hereinafter, a configuration of a smartphone as an imaging device will be described with reference to FIG. 9.

Figure 9:
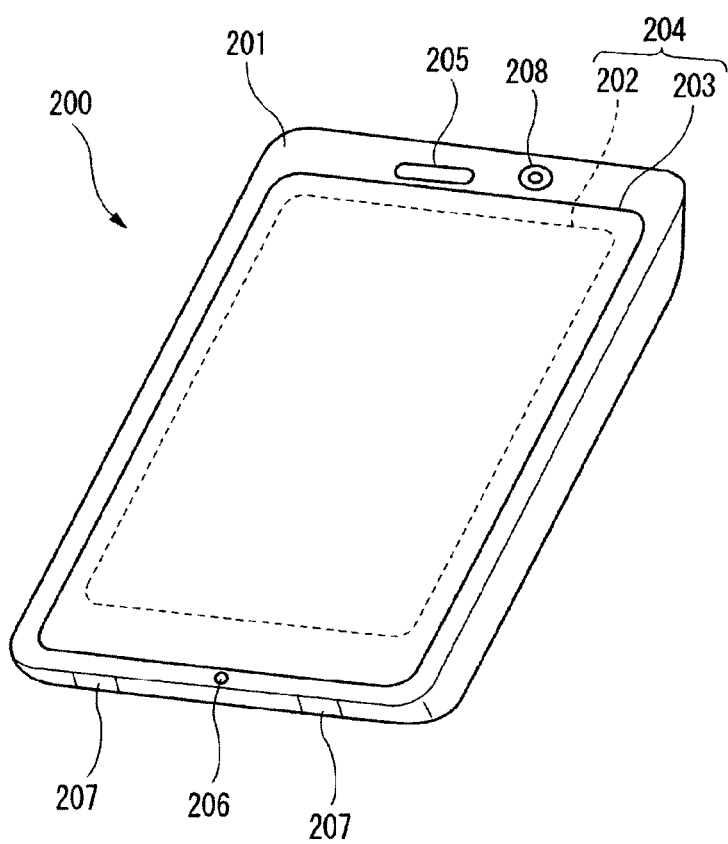
FIG. 9 is a view illustrating a smartphone as an imaging device.

FIG. 9 illustrates an outer appearance of a smart phone 200 which is an embodiment of a photographing device of the present invention. The smart phone 200 illustrated in FIG. 8 includes a flat panel type housing 201 and is provided, on one surface of the housing 201, with a display input unit 204 in which a display panel 202 as a display unit, and an operating panel 203 as an input unit are integrated. In addition, the housing 201 includes a speaker 205, a microphone 206, an operating unit 207, and a camera 208. However, a configuration of the housing 201 is not limited thereto. For example, a configuration in which the display unit and the input unit are independent from each other may be employed or a configuration having a folding structure or a slide mechanism may be employed.

Figure 10:
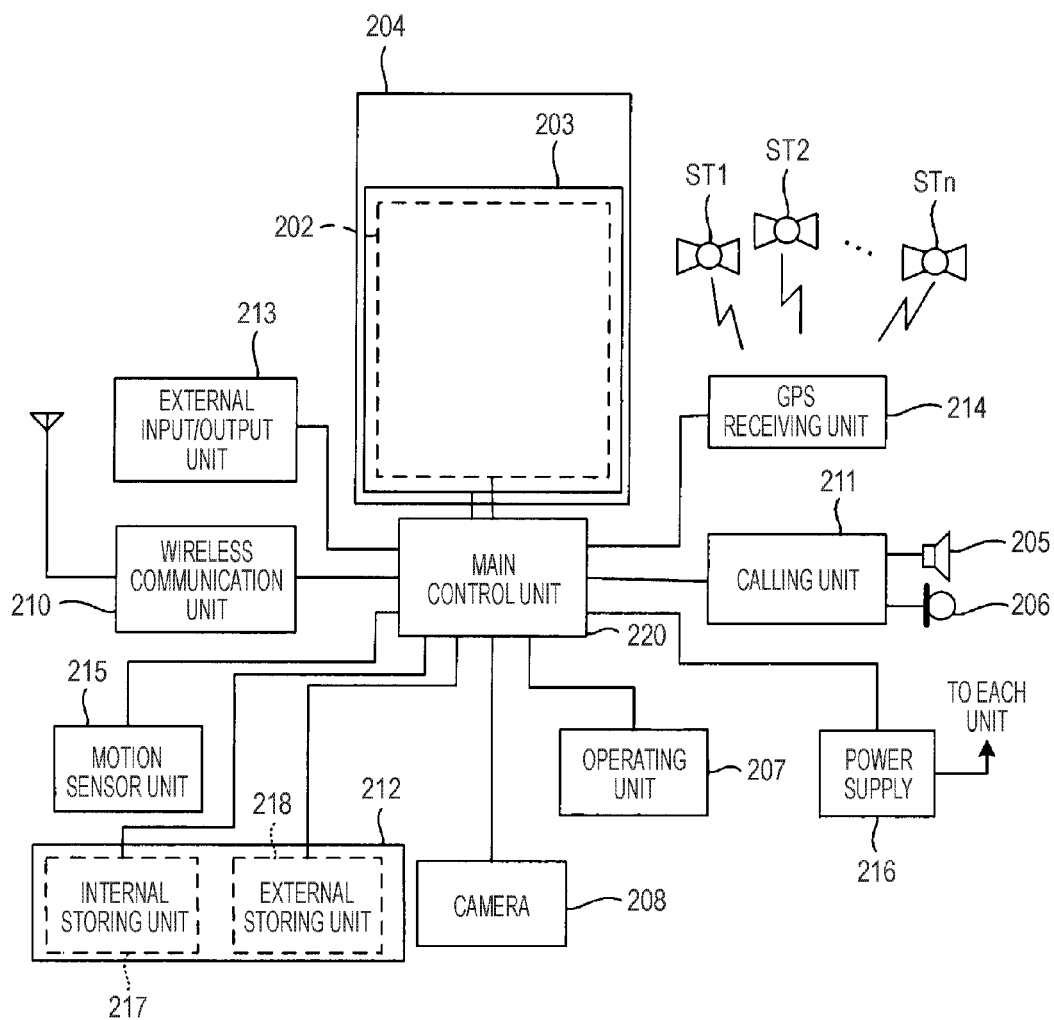
FIG. 10 is an internal block diagram of the smartphone of FIG. 9.

FIG. 10 is a block diagram illustrating a configuration of the smart phone 200 illustrated in FIG. 9. As illustrated in FIG. 10, as main components, the smart phone includes a wireless communication unit 210, a display input unit 204, a calling unit 211, an operating unit 207, a camera 208, a storing unit 212, an external input/output unit 213, a global positioning system (GPS) receiving unit 214, a motion sensor unit 215, a power supply 216, and a main control unit 220. Further, as a main function of the smart phone 200, the smartphone 200 is provided with a wireless communication function which performs mobile wireless communication through a base station device BS which is not illustrated and a mobile communication network NW which is not illustrated.

The wireless communication unit 210 performs wireless communication with a base station device BS which is accommodated in a mobile communication network NW in accordance with an instruction of the main control unit 220. Using the wireless communication, the wireless communication unit 210 transmits/receives various file data such as voice data and image data and electronic mail data or receives web data, streaming data, or the like.

The display input unit 204 is provided with a display panel 202 and an operating panel 203 as a so-called touch panel which displays an image (a still image or a moving picture) or text information under the control of the main control unit 220 so as to visually transmit information to a user, and detects the user's operation on displayed information.

The display panel 202 uses a liquid crystal display (LCD), an organic electro-luminescence display (OELD), or the like, as a display device.

The operating panel 203 is a device which is disposed to allow an image displayed on a display surface of the display panel 202 to be visually recognized and detects one or a plurality of coordinates which can be operated by a finger of the user or a stylus. When the device is operated by the finger of the user or the stylus, a detection signal which is generated based on the operation is output to the main control unit 220. Subsequently, the main control unit 220 detects an operating position (coordinate) on the display panel 202, based on the received detection signal.

As illustrated in FIG. 9, although the display panel 202 and the operating panel 203 of the smart phone 200 exemplified as an embodiment of the photographing device of the present invention are integrated with each other to constitute the display input unit 204, the operating panel 203 is disposed to completely cover the display panel 202.

When such an arrangement is employed, the operating panel 203 may be provided with a function of detecting the user's operation on a region other than the display panel 202. In other words, the operating panel 203 may include a detection region (hereinafter, referred to as a display region) on an overlapping portion which overlaps the display panel 202 and a detection region (hereinafter, referred to as a "non-display region") for other outer peripheral portion which does not overlap the display panel 202.

In the meantime, although the size of the display region and the size of the display panel 202 may completely coincide with each other, both sizes do not necessarily coincide with each other. In addition, the operating panel 203 may include two sensitive regions of an outer peripheral portion and an inner portion other than the outer peripheral portion. Moreover, a width of the outer peripheral portion is appropriately designed in accordance with the size of the housing 201. Moreover, as a position detecting system employed in the operating panel 203, a matrix switch system, a resistive layer system, a surface elastic wave system, an infrared system, an electromagnetic induction system, or an electrostatic capacitive system may be exemplified, and any system may be employed.

The calling unit 211 includes the speaker 205 or the microphone 206 and converts the user's voice input through the microphone 206 into voice data to be processed by the main control unit 220 and outputs the converted voice data to the main control unit 220, or decodes voice data received by the wireless communication unit 210 or the external input/output unit 213 and outputs the decoded voice data from the speaker 205. Furthermore, as illustrated in FIG. 9, for example, the speaker 205 may be mounted on the same surface as the surface provided with the display input unit 204 and the microphone 206 may be mounted on a side surface of the housing 201.

The operating unit 207 is a hardware key which uses a key switch and receives an instruction from the user. For example, as illustrated in FIG. 9, the operating unit 207 is a push button type switch which is mounted on a side surface of the housing 201 of the smart phone 200 and turned on when the operating unit 207 is pressed by a finger and turned off by restoring force of a spring when the finger is removed.

The storing unit 212 stores a control program or control data of the main control unit 220, application software, address data to which names, phone numbers, or the like of communication counterparts are correlated, transmitted/received electronic mail data, web data downloaded by web browsing or downloaded content data, and temporarily stores streaming data. Further, the storing unit 212 is configured by an internal storing unit 217 which is equipped in the smart phone and an external storing unit 218 which includes a detachable external memory slot. Furthermore, the internal storing unit 217 and the external storing unit 218 which configure the storing unit 212 are implemented by using a storing medium such as a flash memory type, hard disk type, multimedia card micro type, or card type memory (for example, MicroSD (registered trademark) memory), a random access memory (RAM), or a read only memory (ROM).

The external input/output unit 213 functions as an interface with all external devices which are connected to the smart phone 200 and is configured to be directly or indirectly connected to any other external device by communication (for example, universal serial bus (USB) or IEEE1394) or a network (for example, Internet, wireless LAN, Bluetooth (registered trademark), a radio frequency identification (RFID), an infrared data association (IrDA (registered trademark)), ultra wideband (UWB: registered trademark), or a ZigBee (registered trademark).

As external devices connected to the smart phone 200, a wired/wireless head set, a wired/wireless external charger, a wired/wireless data port, a memory card or a SIM (subscriber identity module) card/UIM (user identity module) card connected through a card socket, an external audio/video device connected through an audio/video input/output (I/O) terminal, a wirelessly connected external audio/video device, a wired/wirelessly connected smart phone, a wired/wirelessly connected personal computer, a wired/wirelessly connected PDA, a wired/wirelessly connected personal computer, or an earphone may be exemplified. The external input/output unit 213 may transmit data which is received from such external devices to individual components in the smart phone 200 and may also allow the data in the smart phone 200 to be transmitted to an external device.

The GPS receiving unit 214 receives GPS signals which are transmitted from GPS satellites ST1 to STn according to an instruction from the main control unit 220 and performs a position measurement operation processing based on the received GPS signals to detect positions including a latitude, a longitude, and a height of the smart phone 200. When the GPS receiving unit 214 may obtain positional information from the wireless communication unit 210 or the external input/output unit 213 (for example, the wireless LAN), the GPS receiving unit 214 may detect a position using that positional information.

The motion sensor unit 215 includes, for example, a three axis acceleration sensor and detects physical movement of the smart phone 200 according to the instruction of the main control unit 220. When the physical movement of the smart phone 200 is detected, the movement direction or acceleration of the smart phone 200 is detected. The detected result is output to the main control unit 220.

The power supply 216 supplies power which is accumulated in a battery (not illustrated) to individual units of the smart phone 200 according to the instruction of the main control unit 220.

The main control unit 220 includes a microprocessor and operates according to a control program or control data stored in the storing unit 212 and collectively controls individual units of the smart phone 200. Further, the main control unit 220 is provided with a mobile communication control function to control individual units of a communication system and an application processing function in order to perform voice communication or data communication through the wireless communication unit 210.

The application processing function is implemented when the main control unit 220 is operated according to the application software which is stored in the storing unit 212. The application processing function includes, for example, an infrared communication function which performs data communication with a counterpart device by controlling the external input/output unit 213, an electronic mail function which transmits/receives an electronic mail, and a web browsing function which browses a web page.

The main control unit 220 is provided with an image processing function which displays an image on the display input unit 204 based on the image data (still image or moving picture data) such as received data or downloaded streaming data. The image processing function refers to a function of decoding the image data and performing image processings on the decoded result to display the image on the display input unit 204 by the main control unit 220.

The main control unit 220 executes a display control of the display panel 202 and an operation detection control which detects a user's operation through the operating unit 207 and the operating panel 203. By executing the display control, the main control unit 220 displays an icon to activate application software or a software key such as a scroll bar or displays a window for preparing an electronic mail. Here, the scroll bar refers to a software key for receiving an instruction to move a displayed portion of an image with respect to a large image which is not covered by the display region of the display panel 202.

By executing the operation detection control, the main control unit 220 detects the user's operation through the operating unit 207 or receives an operation on the icon or the input of a character string of an input section of the window through the operating panel 203 or receives a scroll request of a displayed image through the scroll bar.

By executing the operation detection control, the main control unit 220 is provided with a touch panel control function that controls a sensitive region of the operating panel 203 or a display position of the software key by determining whether the operating position of the operating panel 203 is an overlapping portion (display region) which overlaps the display panel 202 or an outer peripheral portion (non-display region) which does not overlap the display panel 202 other than the overlapping portion.

The main control unit 220 may detect a gesture operation with respect to the operating panel 203 and execute a predetermined function according to the detected gesture operation. The gesture operation refers to an operation which draws a trace using a finger, designates a plurality of positions simultaneously, or a combination thereof to draw a trace for at least one of the plurality of positions, rather than a simple touch operation of the related art.

The camera 208 includes constitutional elements other than the external memory control unit 20, the recording medium 21, the display control unit 22, the display unit 23, and the operating unit 14 in the digital camera which is illustrated in FIG. 1. Captured image data which is generated by the camera 208 may be stored in the storing unit 212 or output through the external input/output unit 213 or the wireless communication unit 210. Although the camera 208 is mounted on the same surface as the display input unit 204 in the smart phone 200 illustrated in FIG. 9, the mounting position of the camera 208 is not limited thereto and the camera 208 may be mounted on a rear surface of the display input unit 204.

The camera 208 may be used for various functions of the smart phone 200. For example, an image which is obtained by the camera 208 may be displayed on the display panel 202 or the image of the camera 208 may be used as one of operation inputs of the operating panel 203. Further, when the GPS receiving unit 214 detects the position, the position may be detected with reference to the image from the camera 208. Moreover, an optical axis direction of the camera 208 of the smart phone 200 may be determined or a current usage environment may also be determined with reference to the image from the camera 208 either without using the 3-axis acceleration sensor or using the 3-axis acceleration sensor. Of course, the image from the camera 208 can be used in the application software.

Positional information obtained by the GPS receiving unit 214, voice information obtained by the microphone 206 (which may be text information obtained by performing a voice-text conversion by the main control unit or the like), or posture information obtained by the motion sensor unit 215 may be added to the image data of a still image or a moving picture to be stored in the storing unit 212 or output through the external input/output unit 213 or the wireless communication unit 210.

In a smartphone 200 having the above-described configuration, high quality photographing may be achieved by the aforementioned signal correction processing performed by the digital signal processing unit 17.

As set forth above, the present specification discloses the following description.

It is disclosed an image processing device that processes a captured image signal output from an imaging element including a plurality of capturing pixels and a plurality of phase difference detecting pixels, the image processing device comprising:

a gain correction processing unit that performs gain correction processing of correcting an output signal of the phase difference detecting pixel included in the captured image signal by multiplying the output signal by a gain value; an interpolation correction processing unit that performs interpolation correction processing of correcting the output signal of the phase difference detecting pixel included in the captured image signal by replacing the output signal with a signal generated based on output signals of capturing pixels adjacent to the phase difference detecting pixel and detecting the same color as a color of the phase difference detecting pixel; and an image processing unit that corrects each output signal of the plurality of phase difference detecting pixels included in the captured image signal using one of the gain correction processing unit and the interpolation correction processing unit, and record the captured image signal after the correction in a recording medium, wherein within a range including a correction target phase difference detecting pixel and a plurality of capturing pixels adjacent to the correction target phase difference detecting pixel and detecting the same color as a color of the correction target phase difference detecting pixel, when a minimum value is Smin, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel using the gain correction processing unit is Sc among the output signals of the capturing pixels, in a case in which Sc<TH1 or Sc>TH2, the image processing unit records, in the recording medium, a signal obtained by correcting the output signal of the correction target phase difference detecting pixel using the interpolation correction processing unit, and the first and second values are based on a value of the output signal of the correction target phase difference detecting pixel and the gain value.

In the image processing device, the range is a range in which at least a capturing pixel detecting the same color as the color of the correction target phase difference detecting pixel is disposed in right, left, upper, lower, upper right diagonal, lower left diagonal, upper left diagonal, and lower right diagonal directions with respect to the correction target phase difference detecting pixel.

In the image processing device, the interpolation correction processing includes maximum/minimum substitution processing of replacing the output signal of the phase difference detecting pixel with the minimum value Smin or the maximum value Smax within the range, and calculation substitution processing of replacing the output signal of the phase difference detecting pixel with a signal generated by a calculation using the output signals of the plurality of capturing pixels adjacent to the phase difference detecting pixel and detecting the same color as the color of the phase difference detecting pixel, and in a case in which TH1≤Sc<Smin or Smax<Sc≤TH2, the image processing unit records, in the recording medium, a signal obtained by correcting the output signal of the correction target phase difference detecting pixel through the maximum/minimum substitution processing.

In the image processing device, the interpolation correction processing includes maximum/minimum substitution processing of replacing the output signal of the phase difference detecting pixel with the minimum value Smin or the maximum value Smax within the range, and calculation substitution processing of replacing the output signal of the phase difference detecting pixel with a signal generated by a calculation using the output signals of the plurality of capturing pixels adjacent to the phase difference detecting pixel and detecting the same color as the color of the phase difference detecting pixel, and in a case in which Sc<TH1 or Sc>TH2, the image processing unit selects one of the maximum/minimum substitution processing and the calculation substitution processing based on a subject within the range, and records, in the recording medium, a signal obtained by correcting the output signal of the correction target phase difference detecting pixel through the selected processing.

In the image processing device, the interpolation correction processing includes calculation substitution processing of replacing the output signal of the phase difference detecting pixel with a signal generated by a calculation using the output signals of the plurality of capturing pixels adjacent to the phase difference detecting pixel and detecting the same color as the color of the phase difference detecting pixel, and in a case in which Smin≤Sc≤Smax, when a difference between a value of the output signal obtained by the calculation substitution processing and the signal value Sc is equal to or less than a threshold value, the image processing unit records, in the recording medium, a signal obtained by correcting the output signal of the correction target phase difference detecting pixel through the calculation substitution processing.

It is disclosed an imaging device comprising: the image processing device; and the imaging element.

It is disclosed an image processing method of processing a captured image signal output from an imaging element including a plurality of capturing pixels and a plurality of phase difference detecting pixels, the image processing method comprising: an image processing step of correcting an output signal of the phase difference detecting pixel included in the captured image signal captured by the imaging element through one of gain correction processing of performing a correction by multiplying the output signal by a gain value and interpolation correction processing of performing a correction by replacing the output signal with a signal generated based on output signals of capturing pixels adjacent to the phase difference detecting pixel and detecting the same color as a color of the phase difference detecting pixel, and of recording the captured image signal after the correction in a recording medium, wherein within a range including a correction target phase difference detecting pixel and a plurality of capturing pixels adjacent to the correction target phase difference detecting pixel and detecting the same color as a color of the correction target phase difference detecting pixel, when a minimum value is Smin, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel through the gain correction processing is Sc among the output signals of the capturing pixels, in a case in which Sc<TH1 or Sc>TH2, the image processing operation step includes recording, in the recording medium, a signal obtained by correcting the output signal of the correction target phase difference detecting pixel through the interpolation correction processing, and the first and second values are based on a value of the output signal of the correction target phase difference detecting pixel and the gain value.

It is disclosed a non-transitory computer readable medium storing an image processing program causing a computer to perform processing a captured image signal output from an imaging element including a plurality of capturing pixels and a plurality of phase difference detecting pixels, the processing comprising: an image processing step of correcting an output signal of the phase difference detecting pixel included in the captured image signal captured by the imaging element through one of gain correction processing of performing a correction by multiplying the output signal by a gain value and interpolation correction processing of performing a correction by replacing the output signal with a signal generated based on output signals of capturing pixels adjacent to the phase difference detecting pixel and detecting the same color as a color of the phase difference detecting pixel, and of recording the captured image signal after the correction in a recording medium, wherein within a range including a correction target phase difference detecting pixel and a plurality of capturing pixels adjacent to the correction target phase difference detecting pixel and detecting the same color as a color of the correction target phase difference detecting pixel, when a minimum value is Sm in, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel through the gain correction processing is Sc among the output signals of the capturing pixels, in a case in which Sc<TH1 or Sc>TH2, the image processing operation step includes recording, in the recording medium, a signal obtained by correcting the output signal of the correction target phase difference detecting pixel through the interpolation correction processing, and the first and second values are based on a value of the output signal of the correction target phase difference detecting pixel and the gain value.

It is disclosed an image processing device processing a captured image signal output from an imaging element including a plurality of capturing pixels and a plurality of phase difference detecting pixels, the image processing device comprising: a gain correction processing unit that performs gain correction processing of correcting an output signal of the phase difference detecting pixel included in the captured image signal captured by the imaging element by multiplying the output signal by a gain value; an interpolation correction processing unit that performs interpolation correction processing by replacing the output signal of the phase difference detecting pixel included in the captured image signal with a signal generated based on output signals of capturing pixels adjacent to the phase difference detecting pixel and detecting the same color as a color of the phase difference detecting pixel; and an image processing unit that corrects each output signal of the plurality of phase difference detecting pixels using one of the gain correction processing unit and the interpolation correction processing unit, and record the captured image signal after the correction in a recording medium, wherein within a range including a correction target phase difference detecting pixel and a plurality of capturing pixels adjacent to the correction target phase difference detecting pixel and detecting the same color as a color of the correction target phase difference detecting pixel, when a minimum value is Smin, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel through the gain correction processing is Sc among the output signals of the capturing pixels, in a case in which TH1≤Sc<Smin or Smax<Sc≤TH2, the image processing unit records, in the recording medium, a signal obtained by correcting the output signal of the correction target phase difference detecting pixel using the interpolation correction processing unit, the first and second values are based on a value of the output signal of the correction target phase difference detecting pixel and the gain value, and the interpolation correction processing performed by the interpolation correction processing unit is processing of replacing the output signal of the phase difference detecting pixel with the minimum value Smin or the maximum value Smax within the range.

These disclosed matters may be applied to the digital camera, and the like, thereby achieving relatively high convenience and efficiency.

What is claimed is:

1. An image processing device that processes a captured image signal output from an imaging element including a plurality of capturing pixels and a plurality of phase difference detecting pixels, the image processing device comprising:

a gain correction processing unit that performs gain correction processing of correcting an output signal of the phase difference detecting pixel included in the captured image signal by multiplying the output signal by a gain value;

an interpolation correction processing unit that performs interpolation correction processing of correcting the output signal of the phase difference detecting pixel included in the captured image signal by replacing the output signal with a signal generated based on output signals of capturing pixels adjacent to the phase difference detecting pixel and detecting the same color as a color of the phase difference detecting pixel; and an image processing unit that corrects each output signal of the plurality of phase difference detecting pixels included in the captured image signal using one of the gain correction processing unit and the interpolation correction processing unit, and record the captured image signal after the correction in a recording medium, wherein within a range including a correction target phase difference detecting pixel and a plurality of capturing pixels adjacent to the correction target phase difference detecting pixel and detecting the same color as a color of the correction target phase difference detecting pixel, when a minimum value is Smin, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel using the gain correction processing unit is Sc among the output signals of the capturing pixels, in a case in which Sc<TH1 or Sc>TH2, the image processing unit records, in the recording medium, a signal obtained by correcting the output signal of the correction target phase difference detecting pixel using the interpolation correction processing unit, and the first and second values are based on a value of the output signal of the correction target phase difference detecting pixel and the gain value.

2. The image processing device of claim 1, wherein the range is a range in which at least a capturing pixel detecting the same color as the color of the correction target phase difference detecting pixel is disposed in right, left, upper, lower, upper right diagonal, lower left diagonal, upper left diagonal, and lower right diagonal directions with respect to the correction target phase difference detecting pixel.

3. The image processing device of claim 1, wherein the interpolation correction processing includes maximum/minimum substitution processing of replacing the output signal of the phase difference detecting pixel with the minimum value Smin or the maximum value Smax within the range, and calculation substitution processing of replacing the output signal of the phase difference detecting pixel with a signal generated by a calculation using the output signals of the plurality of capturing pixels adjacent to the phase difference detecting pixel and detecting the same color as the color of the phase difference detecting pixel, and in a case in which TH1≤Sc<Smin or Smax<Sc≤TH2, the image processing unit records, in the recording medium, a signal obtained by correcting the output signal of the correction target phase difference detecting pixel through the maximum/minimum substitution processing.

4. The image processing device of claim 1, wherein the interpolation correction processing includes maximum/minimum substitution processing of replacing the output signal of the phase difference detecting pixel with the minimum value Smin or the maximum value Smax within the range, and calculation substitution processing of replacing the output signal of the phase difference detecting pixel with a signal generated by a calculation using the output signals of the plurality of capturing pixels adjacent to the phase difference detecting pixel and detecting the same color as the color of the phase difference detecting pixel, and in a case in which Sc<TH1 or Sc>TH2, the image processing unit selects one of the maximum/minimum substitution processing and the calculation substitution processing based on a subject within the range, and records, in the recording medium, a signal obtained by correcting the output signal of the correction target phase difference detecting pixel through the selected processing.

5. The image processing device of claim 1, wherein the interpolation correction processing includes calculation substitution processing of replacing the output signal of the phase difference detecting pixel with a signal generated by a calculation using the output signals of the plurality of capturing pixels adjacent to the phase difference detecting pixel and detecting the same color as the color of the phase difference detecting pixel, and in a case in which Smin≤Sc≤Smax, when a difference between a value of the output signal obtained by the calculation substitution processing and the signal value Sc is equal to or less than a threshold value, the image processing unit records, in the recording medium, a signal obtained by correcting the output signal of the correction target phase difference detecting pixel through the calculation substitution processing.

6. An imaging device comprising:
the image processing device of claim 1; and
the imaging element.

7. An image processing method of processing a captured image signal output from an imaging element including a plurality of capturing pixels and a plurality of phase difference detecting pixels, the image processing method comprising:

an image processing step of correcting an output signal of the phase difference detecting pixel included in the captured image signal captured by the imaging element through one of gain correction processing of performing a correction by multiplying the output signal by a gain value and interpolation correction processing of performing a correction by replacing the output signal with a signal generated based on output signals of capturing pixels adjacent to the phase difference detecting pixel and detecting the same color as a color of the phase difference detecting pixel, and of recording the captured image signal after the correction in a recording medium, wherein within a range including a correction target phase difference detecting pixel and a plurality of capturing pixels adjacent to the correction target phase difference detecting pixel and detecting the same color as a color of the correction target phase difference detecting pixel, when a minimum value is Smin, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel through the gain correction processing is Sc among the output signals of the capturing pixels, in a case in which Sc<TH1 or Sc>TH2, the image processing operation step includes recording, in the recording medium, a signal obtained by correcting the output signal of the correction target phase difference detecting pixel through the interpolation correction processing, and the first and second values are based on a value of the output signal of the correction target phase difference detecting pixel and the gain value.

8. A non-transitory computer readable medium storing an image processing program causing a computer to perform processing a captured image signal output from an imaging element including a plurality of capturing pixels and a plurality of phase difference detecting pixels, the processing comprising:

an image processing step of correcting an output signal of the phase difference detecting pixel included in the captured image signal captured by the imaging element through one of gain correction processing of performing a correction by multiplying the output signal by a gain value and interpolation correction processing of performing a correction by replacing the output signal with a signal generated based on output signals of capturing pixels adjacent to the phase difference detecting pixel and detecting the same color as a color of the phase difference detecting pixel, and of recording the captured image signal after the correction in a recording medium, wherein within a range including a correction target phase difference detecting pixel and a plurality of capturing pixels adjacent to the correction target phase difference detecting pixel and detecting the same color as a color of the correction target phase difference detecting pixel, when a minimum value is Smin, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel through the gain correction processing is Sc among the output signals of the capturing pixels, in a case in which Sc<TH1 or Sc>TH2, the image processing operation step includes recording, in the recording medium, a signal obtained by correcting the output signal of the correction target phase difference detecting pixel through the interpolation correction processing, and the first and second values are based on a value of the output signal of the correction target phase difference detecting pixel and the gain value.

9. An image processing device processing a captured image signal output from an imaging element including a plurality of capturing pixels and a plurality of phase difference detecting pixels, the image processing device comprising:

a gain correction processing unit that performs gain correction processing of correcting an output signal of the phase difference detecting pixel included in the captured image signal captured by the imaging element by multiplying the output signal by a gain value;

an interpolation correction processing unit that performs interpolation correction processing by replacing the output signal of the phase difference detecting pixel included in the captured image signal with a signal generated based on output signals of capturing pixels adjacent to the phase difference detecting pixel and detecting the same color as a color of the phase difference detecting pixel; and an image processing unit that corrects each output signal of the plurality of phase difference detecting pixels using one of the gain correction processing unit and the interpolation correction processing unit, and record the captured image signal after the correction in a recording medium,
  wherein within a range including a correction target phase difference detecting pixel and a plurality of capturing pixels adjacent to the correction target phase difference detecting pixel and detecting the same color as a color of the correction target phase difference detecting pixel, when a minimum value is Smin, a maximum value is Smax, a value obtained by subtracting a first value from the minimum value Smin is TH1, a value obtained by adding a second value to the maximum value Smax is TH2, and a signal value obtained by correcting an output signal of the correction target phase difference detecting pixel through the gain correction processing is Sc among the output signals of the capturing pixels, in a case in which TH1≤Sc<Smin or Smax<Sc≤TH2, the image processing unit records, in the recording medium, a signal obtained by correcting the output signal of the correction target phase difference detecting pixel using the interpolation correction processing unit,
  the first and second values are based on a value of the output signal of the correction target phase difference detecting pixel and the gain value, and
  the interpolation correction processing performed by the interpolation correction processing unit is processing of replacing the output signal of the phase difference detecting pixel with the minimum value Smin or the maximum value Smax within the range.

* * * * *